(12) United States Patent
Downing

(10) Patent No.: US 9,899,789 B2
(45) Date of Patent: Feb. 20, 2018

(54) THERMAL MANAGEMENT SYSTEMS

(71) Applicant: Hamilton Sundstrand Corporation, Charlotte, NC (US)

(72) Inventor: Robert S. Downing, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 414 days.

(21) Appl. No.: 14/827,823

(22) Filed: Aug. 17, 2015

(65) Prior Publication Data

US 2017/0054265 A1   Feb. 23, 2017

(51) Int. Cl.
*H01S 3/04* (2006.01)
*H01S 3/042* (2006.01)
*H01S 5/024* (2006.01)
*F28D 15/02* (2006.01)
*F28D 20/02* (2006.01)
*H01S 3/041* (2006.01)
*F28D 20/00* (2006.01)
*F28D 21/00* (2006.01)

(52) U.S. Cl.
CPC .......... *H01S 3/0407* (2013.01); *F28D 15/025* (2013.01); *F28D 15/0266* (2013.01); *F28D 20/02* (2013.01); *H01S 3/04* (2013.01); *H01S 3/042* (2013.01); *H01S 5/024* (2013.01); *H01S 5/02423* (2013.01); *H01S 5/02438* (2013.01);
*F28D 20/00* (2013.01); *F28D 2021/0028* (2013.01); *H01S 3/041* (2013.01)

(58) Field of Classification Search
CPC ........ H01S 3/0407; H01S 3/042; H01S 3/041; H01S 3/04; H01S 5/02423; H01S 5/02438; H01S 5/024
See application file for complete search history.

(56) References Cited

U.S. PATENT DOCUMENTS

| | | | |
|---|---|---|---|
| 5,253,260 A * | 10/1993 | Palombo | F28D 15/0275 372/34 |
| 2005/0220429 A1* | 10/2005 | Davis | G02B 6/02 385/123 |
| 2008/0212620 A1* | 9/2008 | Abdeldayem | H01S 3/0602 372/6 |
| 2012/0085518 A1* | 4/2012 | Ichkahn | F28D 15/0275 165/104.26 |

* cited by examiner

Primary Examiner — Kinam Park
(74) Attorney, Agent, or Firm — Locke Lord LLP; Scott D. Wofsy; Arpita G. Buesing

(57) ABSTRACT

A thermal management system for removing excess heat from a heat source includes a condenser and an evaporator fluidly connected together within a cooling loop. A phase change material is positioned within the condenser. The phase change material is configured to melt with a liquid coolant warmed by the evaporator. The phase change material is also configured solidify with the liquid coolant cooled by the condenser to temperatures below the melting point.

8 Claims, 2 Drawing Sheets

THERMAL MANAGEMENT SYSTEMS

BACKGROUND OF THE INVENTION

1. Field of the Invention

The present disclosure relates to generally to thermal management systems, and more particularly to cooling system such as for transferring heat.

2. Description of Related Art

Applications such as high power lasers, electronics, power generators and conversion equipment all generate waste heat and require cooling. In many of these applications the cooling heat flux is high or a suitable heat sink is not adjacent to the heat losses. In these cases a thermal loop maybe used that acquires heat where it is dissipated and transports that heat to a heat exchanger at the heat sink. Typically, such cooling systems can add significantly to the overall system mass, size, and average power consumption. Most commonly the coolant is a single phase fluid (gas or liquid) that works by sensible heating and cooling i.e., increases in temperature as it acquires heat at the heat load and decreases in temperature in the heat exchanger at the heat sink.

In some systems, for example LASERs, microwaves and other Directed Energy Weapons (DEW), the heat losses may be very intermittent with rest periods much longer than the power burst. Thermal systems that transport and reject these discontinuous heat loads as they occur will be unnecessarily large and heavy because they must be designed for peak energy conditions. If a cooling system includes Thermal Energy Storage (TES) the peak heat rejection rate can be reduced and the heat sink heat exchangers can be smaller and lighter. The utilization of thermal energy storage can reduce the heat rejection rate from the short duration peak value to a much lower rate of heat rejection at the heat sink. In the ideal case with thermal storage, heat is continuously rejected to the heat sink at the time averaged heat load over the duty cycle. Therefore, thermal management systems that can store as well as reject heat from non-steady thermal loads can be smaller and lighter than systems that reject heat as it is generated.

Conventional single phase thermal management systems without thermal storage have generally been considered satisfactory for their intended purpose. However, there is still a need in the art for improved thermal management systems. The present disclosure presents a thermal management system for intermittent heat loads that will be smaller, lighter and require less power than conventional approaches by utilizing thermal storage integrated into a two-phase loop.

SUMMARY OF THE INVENTION

A thermal management system for removing excess heat from a heat source includes a condenser and an evaporator fluidly connected together within a cooling loop. A phase change material is positioned within the condenser. The phase change material is configured to melt with a liquid coolant warmed by the evaporator. The phase change material is also configured solidify with the liquid coolant cooled by the condenser to temperatures below the melting point.

The phase change material can be within a tapered section of the condenser. The condenser can be tapered down in the first direction of flow with the liquid coolant cooling a heat source. The condenser and evaporator can be arranged within the cooling system to generate a one to one ratio of pressure and temperature drop.

The phase change material can include wax. During a heat storage phase a boiling temperature of the liquid coolant can be greater than a melting temperature of the phase change material causing the phase change material to melt and absorb heat from the evaporator. During a heat recovery phase a cooling temperature of the liquid coolant can be less than a melting temperature of the phase change material causing the phase change material to transfer from a melted state to a solid state.

The thermal management system includes a liquid-vapor refrigerant such that fluid changes phases. Boiling occurs at the heat source and the vapor then condenses at heat sinks. The liquid refrigerant can include R-134.

A laser system includes a cooling system as described above and a pulse laser in thermal communication, e.g., thermal conduction, with the evaporator.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
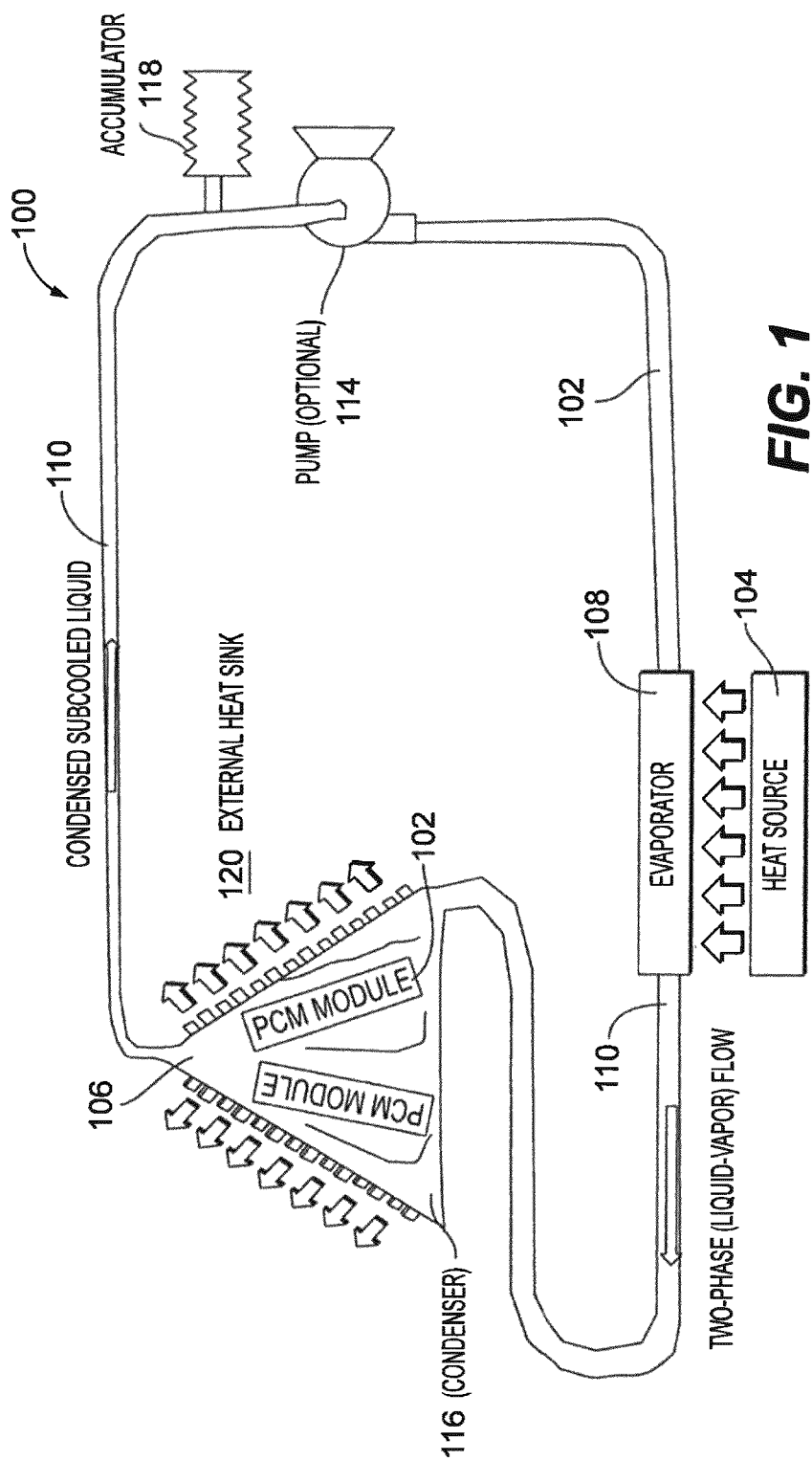
FIG. 1 is a schematic view of an exemplary embodiment of a thermal management constructed in accordance with the present disclosure, showing an energy storage mode.

Reference will now be made to the drawings wherein like reference numerals identify similar structural features or aspects of the subject disclosure. For purposes of explanation and illustration, and not limitation, a partial view of an exemplary embodiment of a thermal management system in accordance with the disclosure is shown in FIG. 1 and is designated generally by reference character 100. An illustrative graph of representative system temperatures during repeated duty cycles is shown conceptually in FIG. 2. A simplified case of sequential and identical duty cycles is illustrated. The temperatures shown are only representative for a component noted. In actuality the temperature will vary according with location for each component.

A thermal management system 100 is shown in FIG. 1. For low duty cycle loads (intermittent) a Thermal Energy Storage (TES) device in the thermal loop has been employed. Storage of excess energy during peak heat loss periods can reduce the energy discharged at the heat sink to lower values. The heat sink heat exchanger can therefore be smaller because it is sized for the average heat loss rather the peak losses. It is also possible to reduce the temperature swing of the coolant or the design for a reduced mass flow. The system is configured to use a phase change material (PCM) 102 that absorbs heat from a device 104, to increase the rate at which the device 104 can operate. The material of the PCM 102 is selected to have a melting point near the desired operating temperature of the electronics. When the loop temperature rises above the melting point, the PCM 102 will melt, storing heat and slowing the rise in coolant temperature. During periods that the heat load is off or at a reduced value the heat rejection from the thermal loop exceeds the input and the coolant will decrease in temperature. As the coolant drops below the melting point of the PCM 102 will re-freeze, releasing heat for rejection at the sink.

The system includes a condenser 106 and an evaporator 108 fluidly connected together within a cooling loop 110. The device or heat source 104 is thermally connected to the evaporator 108. The device can be, for example, electronics, pulse laser or any similar type of intermittently operated device. As commonly used in liquid loops, an accumulator 118 may be included. The accumulator 118 allows for thermal expansion of the coolant during temperature changes. The condenser and evaporator can be arranged within the cooling system to generate a one to one ratio of pressure and temperature drop. This follows from the thermodynamic relationship between pressure and temperature for saturation conditions of a two-phase flow. With both liquid and vapor phases present there is a single unique pressure that will exist for every temperature of the mixture. The saturation pressure, also termed the "vapor pressure" increases with the two-phase mixture temperature.

The PCM 102 is located within a tapered section 116 of the condenser and can include wax. The family of paraffin waxes has melting points that increase with molecular weight. Therefore, the desired melting point that best matches the thermal range of the heat source 104 can be found by selecting the appropriate molecular weight. Waxes typically have low thermal conductivities and change volume with phase change. To mitigate these challenges, the PCM 102 is commonly contained in a metal matrix type structure like a finned compact heat exchanger core.

With continued reference to FIG. 1, the system 100 is in an energy storage mode when the device or heat source 104 is generating heat. The system 100 uses a working fluid (i.e. coolant) during the cooling cycle. As the heat source 104 temperature increases, boiling will occur and the bulk coolant temperature will be warmed to saturation. At this point the evaporator 108 will be producing vapor that is carried with the liquid. The temperature and pressure of the coolant will rise if all the vapor generated cannot be condensed in the condenser. The coolant in a two phase flow with a mixture of liquid and vaporized coolant enters the condenser 106 and passes through the condenser 106 in a tapered down direction. Some of the vapor generated will be condensed directly by the external condensed surface (shown finned) and some will condense on the PCM 102. During the heat storage phase a boiling temperature of the liquid coolant is greater than a melting temperature of the PCM 102 causing the PCM 102 to melt and absorb heat from the evaporator 108. The coolant exits the condenser as a condensed subcooled liquid and flows back to the evaporator 108 to provide a cooling effect to the heat source 104. The addition of the phase change material 102 within the cooling loop provides a thermal energy storage or heat sink which prevents or reduces temperature swings. As lasers are generally intolerant of temperature variations, the phase change material helps provide a thermal management system which limits coolant temperature fluctuations with on/off periods of the heat source.

During a heat recovery phase, when the heat source is turned off, a cooling temperature of the liquid coolant is less than a melting temperature of the PCM 102 causing the PCM 102 to lose heat and the melted or partially melted PCM 102 will re-freeze from a melted state to a solid state.

As in thermosiphons used for two-phase cooling applications, density differences between the vapor and liquid drive a flow circulation in the loop without external pumping. However, the flow velocities and heat fluxes are limited because the frictional pressure drops of the flow in channels must be overcome by the hydrostatic pumping head. For higher performance loops a pump 114 may be used. Heat transfer coefficients will be increased resulting in smaller temperature differences. Also, the maximum heat flux, limited by heat source surface dry-out in boiling, will be increased.

The thermal management system includes a liquid refrigerant selected to vaporize at heated surfaces for removing heat and condense on surfaces where heat is removed. In steady conditions, the pressure level in two phase cooling loops automatically adjusts to a value such that the corresponding saturation temperature makes the heat gain equal to the heat loss. A refrigerant such as R-134a may be used in part because the pressure levels at the working temperature range are easily contained in loop plumbing and heat exchangers.

The tapered section 116 of the condenser 106 provides a more consistent flow (i.e. velocity) for the coolant. Tapered condensers, also termed "shear flow" condensers offer several advantages over designs having uniform cross sectional condensers. As a flowing two phase mixture condenses the effective density of the mixture greatly increases because liquid densities are much greater than vapor densities. In a channel with a uniform cross sectional area the average velocity will rapidly diminish as more of the flow is condensed. This decrease in velocity will be lessened in a channel with an area tapered down in the direction of flow.

Keeping a higher and more uniform velocity has several advantages which improves the efficiency of the condenser. Firstly, the film of liquid that forms by condensation on the cooled walls is thinner due to shear forces of higher vapor velocities. Since the primary resistance to heat transfer in condensation is conduction across the condensate layer, tapered flow condensers will have higher heat transfer coefficients. With higher heat transfer coefficients the heat exchanger can be made smaller and lighter or a greater amount of heat can be transferred from the same size unit. Secondly, the deleterious effect of non-condensable gases is mitigated in shear flow condensers. Non-condensable gases (NCG), like air are always present in two-phase systems. These gases inhibit condensation because they form a "blanket" of high concentration over condensing films. The vapor carries the non-condensables to the cold surface on its way to the cold wall for condensation. The NCG blanket is a resistance to heat transfer because the vapor molecules must diffuse through this layer. If the condensing channel is tapered, the higher vapor velocities convert NCGs further downstream thereby concentrating there inhibiting effect to a much smaller region in the downstream end of the condenser. Lastly, a shear flow condenser can eliminate flow instabilities because the increased frictional pressure loss can offset the momentum and pressure recovery inherent in a slowing flow, like condensation. Several types of flow instabilities, either in flow pattern (liquid-vapor spacial distribution) or in flow direction or flow distribution between parallel channels can be mitigated. Possible instabilities include, liquid-leg, runback, manifold, and reduced gravity.

Figure 2:
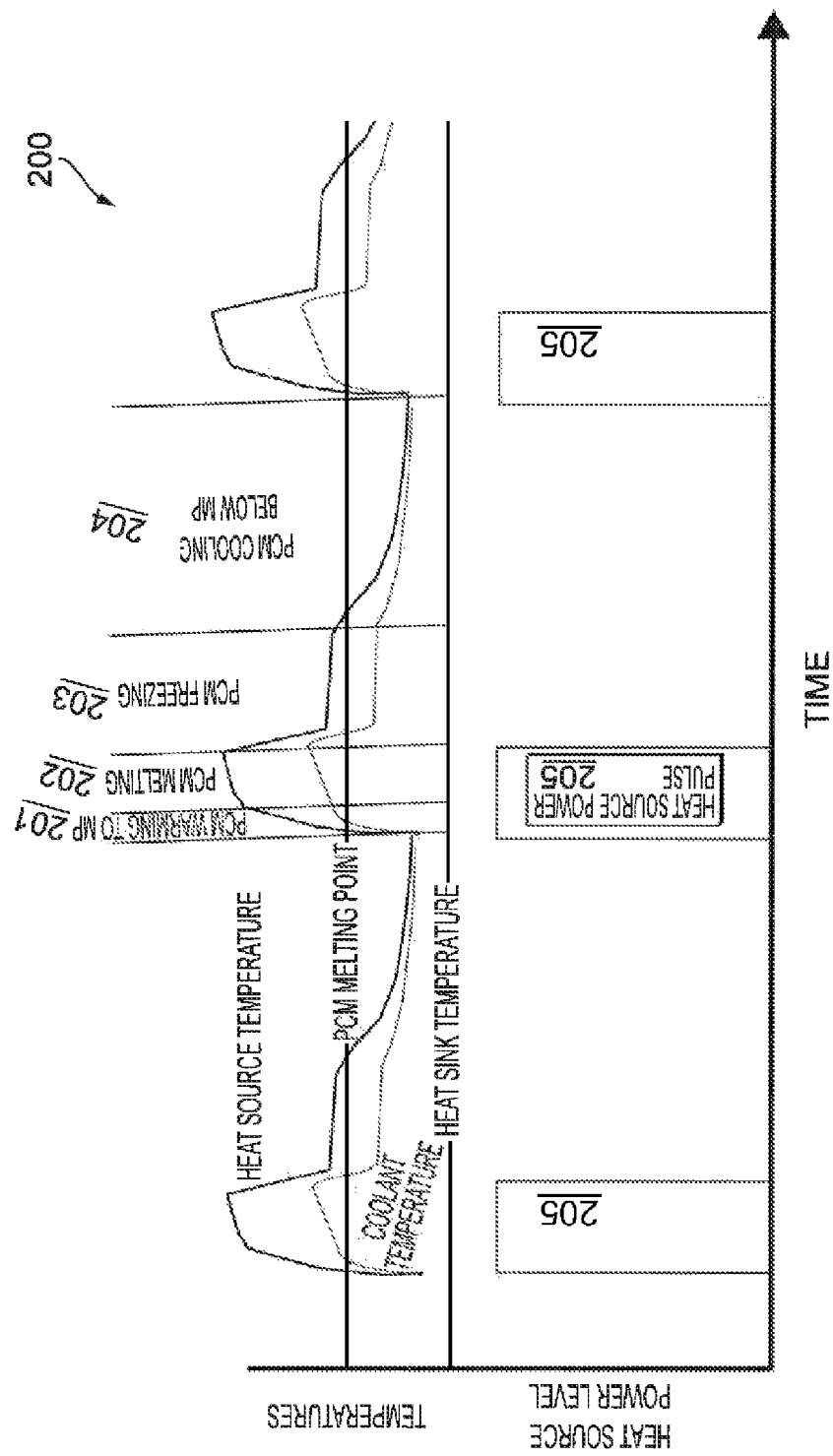
FIG. 2 graphically shows in concept the temporal temperature and power values over successive identical duty cycles. In practice the duty cycles may vary but the concept is best illustrated as shown.

FIG. 2 is a graph 100 that conceptually illustrates the transient variations in temperature of key components in the system 100 of FIG. 1 with the two-phase thermal cooling loop 110. Three power pulses 205 are shown, selected here to be of equal power, duration and period of occurrence. The heat dissipation and recovery periods are each divided into two time periods. Starting at a fully recovered condition, in the first time segment, 201, the loop coolant temperature rises quickly with the initial heat dissipation. The rapid rate of coolant temperature increase occurs with sensible heating of the coolant. Local boiling, termed subcooled boiling, may occur at the heated surface prior to the bulk coolant temperature reaching saturation conditions. The PCM 102 will be warming during this time period and their temperature will approach the melting point. During the next period, 202 the PCM 102 will be melting. The coolant temperature will slowly rise as conduction resistance through the melted portion of PCM 102 increases as the amount of liquid increases. In both heat dissipation periods, 201 and 202, heat is rejected to the external heat sink 120 (shown in FIG. 1) and stored in the PCM 102. During heat dissipation the heat source temperature is greater than the coolant temperature by an amount proportional to the heat flux divided times the convective resistance, $1/(hA)$. The heat transfer coefficient is h with the cooling over an area A. Because heat transfer coefficients increase with flow velocity a pump 114 may be included in the cooling loop.

In a similar fashion to the heat dissipation periods, the temperatures decrease during the recovery periods, 203 and 204. The PCM 102 and coolant temperatures drop slowly initially, during time segment 203 because the PCM 102 is refreezing. The vapor generated at the PCM 102 surface is condensed on the surface of the condenser that is cooled by the external heat sink 120. After the PCM 102 is frozen the loop temperature will gradually approach the external sink temperature. The approach is slow because the heat transfer coefficients are small (single phase liquid only) and the driving temperature difference is gradually disappearing. Logically, the heat source temperature will drop quickly after the heat dissipation stops, starting in time segment 203. The cooling rate of the heat source is dependent on its thermal capacitance.

The methods and systems of the present disclosure, as described above and shown in the drawings, provide for a thermal management system with superior properties including thermal energy storage. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A thermal management system for removing excess heat from a heat source, comprising:
    a condenser and an evaporator fluidly connected together within a cooling loop; and
    a phase change material within the condenser, wherein the phase change material is configured to:
        melt with liquid coolant warmed by the evaporator;
        solidify with the liquid coolant when cooled by the condenser to temperatures below melting; and
        wherein the phase change material is within a tapered section of the condenser and the condenser is tapered down in the direction of flow with the liquid coolant cooling a heat source.

2. The system of claim 1, wherein the condenser and evaporator are arranged within the cooling system to generate a one to one relationship of pressure and temperature drop.

3. The system of claim 1, wherein the phase change material includes wax.

4. The system of claim 1, wherein material of the phase change material has a melting point near the desired operating temperature of a heat source.

5. The system of claim 1, wherein during a heat storage phase a boiling temperature of the liquid coolant is greater than a melting temperature of the phase change material causing the phase change material to melt and absorb heat from the evaporator.

6. The system of claim 1, wherein during a heat recovery phase a cooling temperature of the liquid coolant is less than a melting temperature of the phase change material causing the phase change material to transfer from a melted state to a solid state.

7. The system of claim 1, wherein the liquid refrigerant includes R-134.

8. The system of claim 1, further comprising an accumulator configured to allow for thermal expansion of the coolant during temperature changes.

* * * * *